US007751574B2

(12) United States Patent
Kushida

(10) Patent No.: US 7,751,574 B2
(45) Date of Patent: Jul. 6, 2010

(54) REVERBERATION APPARATUS CONTROLLABLE BY POSITIONAL INFORMATION OF SOUND SOURCE

(75) Inventor: Koji Kushida, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 958 days.

(21) Appl. No.: 10/808,030

(22) Filed: Mar. 23, 2004

(65) Prior Publication Data

US 2004/0196983 A1 Oct. 7, 2004

(30) Foreign Application Priority Data

Apr. 2, 2003 (JP) ............................ 2003-099565

(51) Int. Cl.
*H03G 3/00* (2006.01)
*H04R 1/10* (2006.01)

(52) U.S. Cl. ............................ 381/63; 381/61; 381/74

(58) Field of Classification Search .................. 381/63, 381/61, 310, 74, 119
See application file for complete search history.

(56) References Cited

U.S. PATENT DOCUMENTS 5,467,401 A * 11/1995 Nagamitsu et al. ............ 381/63
6,188,769 B1 2/2001 Jot et al.
6,608,903 B1 8/2003 Miyazaki et al.

FOREIGN PATENT DOCUMENTS

| | | |
|---|---|---|
| EP | 0593228 | 10/1993 |
| EP | 1357536 | 10/2003 |
| JP | 6-59670 | 3/1994 |
| JP | 2000-197198 | 7/2000 |
| JP | 2001-251698 | 9/2001 |
| JP | 2001-125578 | 11/2001 |

OTHER PUBLICATIONS

McGrath David S. and Reilly, Andrew; Creation, Manipulation and Playback of Soundfields with the Huron Digital Audio Convolution Workstation, International Synposium on Signal Processing and its Applications, ISSPA, Gold Coast, Australia, 25030 Aug. 1996, pp. 288-291.

European Search Report mailed May 26, 2008, for EP Application No. 04101234.5, three pages.

Notice of Reasons for Rejection mailed Jan. 16, 2007, for JP Application No. 2003-099565, with English Translation, nine pages.

* cited by examiner

*Primary Examiner*—Vivian Chin
*Assistant Examiner*—Douglas J Suthers
(74) *Attorney, Agent, or Firm*—Morrison & Foerster LLP

(57) ABSTRACT

In a reverberation apparatus, a storage section stores a directional characteristic representing a directivity of generated sound at a sound generating point. A position determining section determines a position of the sound generating point within an acoustic space on the basis of an instruction from the user. An orientation determining section determines an orientation of the sound generating point based on the determined position thereof. An impulse response determining section determines an impulse response for each of sound ray paths along which the sound emitted from the sound generating point travels to reach a sound receiving point, in accordance with the directional characteristic of the generated sound and the orientation of the sound generating point. A calculation section performs a convolution operation between the impulse response and an input audio signal so as to apply thereto the acoustic effect.

16 Claims, 11 Drawing Sheets

FIG.7

RF

| | |
|---|---|
| ACOUSTIC SPACE | XX CONCERT HALL |
| KIND OF SOUND GENERATING POINT | TRUMPET |
| POSITION OF SOUND GENERATING POINT | $(X_S, Y_S, Z_S)$ |
| ORIENTATION OF SOUND GENERATING POINT | $(X_{Sd}, Y_{Sd}, Z_{Sd})$ |
| KIND OF SOUND RECEIVING POINT | HUMAN BEING |
| POSITION OF SOUND RECEIVING POINT | $(X_R, Y_R, Z_R)$ |
| ORIENTATION OF SOUND RECEIVING POINT | $(X_{Rd}, Y_{Rd}, Z_{Rd})$ |
| POSITION OF TARGET POINT | $(X_T, Y_T, Z_T)$ |

FIG.8

TBL1

| SOUND RAY PATH LENGTH | EMITTING DIRECTION | REACHING DIRECTION | NUMBER OF REFLECTIONS | REFLECTION ATTENUATION RATE |
|---|---|---|---|---|
| L1 | $(X_{r1}, Y_{r1}, Z_{r1})$ | $(X_{a1}, Y_{a1}, Z_{a1})$ | 1 | $d_1$ |
| L2 | $(X_{r2}, Y_{r2}, Z_{r2})$ | $(X_{a2}, Y_{a2}, Z_{a2})$ | 2 | $d_2$ |
| • • • | • • • | • • • | • • • | • • • |

FIG.10

TBL2

| REVERBERATION DELAY TIME | COMPOSITE SOUND RAY INTENSITY | COMPOSITE REACHING DIRECTION |
|---|---|---|
| 3msec | $Ic_1$ | $(Xc_1, Yc_1, Zc_1)$ |
| 3.2msec | $Ic_2$ | $(Xc_2, Yc_2, Zc_2)$ |
| ⋮ | ⋮ | ⋮ |

FIG.11

TBL2

| REVERBERATION DELAY TIME | COMPOSITE SOUND RAY INTENSITY | COMPOSITE REACHING DIRECTION | REPRODUCTION CHANNEL INFORMATION |
|---|---|---|---|
| 3msec | $Ic_1$ | $(Xc_1, Yc_1, Zc_1)$ | REPRODUCTION CHANNEL[1] |
| 3.2msec | $Ic_2$ | $(Xc_2, Yc_2, Zc_2)$ | REPRODUCTION CHANNEL[3] |
| ⋮ | ⋮ | ⋮ | ⋮ |

REVERBERATION APPARATUS CONTROLLABLE BY POSITIONAL INFORMATION OF SOUND SOURCE

BACKGROUND OF THE INVENTION

1. Technical Field of the Invention

The present invention relates to a technique for creating acoustic effects simulative of various kinds of acoustic spaces such as a concert hall and a theater and for applying the crated acoustic effects to sounds to be reproduced in other spaces than these acoustic spaces.

2. Prior Art

A technique is conventionally known which reproduces, in a room at user's home or the like (hereafter called a "listening room"), an acoustic space where a sound generating point for emitting sound and a sound receiving point for receiving the sound emitted from the sound generating point are arranged. The use of this technique allows the user to listen to realistic music in his or her listening room as if he or she were enjoying a live performance in a concert hall or theater.

For example, as one of techniques for reproducing a desired sound field, there is a method of determining an impulse response based on various parameters, and convoluting the impulse response into an audio signal representing the music sound to be reproduced. The various parameters characterizing the sound field to be reproduced include the shape of an acoustic space, the arrangement of a sound generating point and sound receiving point, and so on.

More recently, there has been studied an advanced technique for reflecting directional characteristics of the sound generating point or sound receiving point in reproducing a sound field (for example, see Patent Document 1). Under this technique, an impulse response representing the directional characteristics of the sound generating point or sound receiving point is used in the convolution operation, in addition to other parameters such as the shape of the acoustic space and the arrangement of the sound generating point and the sound receiving point. It allows the reproduction of an acoustic space with a great sense of realism.

Patent Document 1 is Japanese Patent Laid-Open No. 2001-125578. The related description is found in Paragraph 0020 of Patent Document 1.

When reproducing a desired acoustic field in the manner as mentioned above, if the user can change the arrangement and further orientation of the sound generating point or sound receiving point as needed, a sound field desired by the user can be reproduced in real time with a great sense of realism. In this case, however, the user is required to specify both the position and the orientation of the sound generating point or sound receiving point each time he or she changes these points. For example, when wanting to change the orientation of the sound receiving point with the movement of the sound generating point, the user needs to perform complicated instructive operations, such as to change the orientation of the sound receiving point at the same time as moving the sound generating point, thereby causing heavy burden on the user.

SUMMARY OF THE INVENTION

The present invention has been made in view of the forgoing circumstances. It is an object of the present invention to provide a reverberation imparting apparatus capable of changing both the position and orientation of the sound generating point or the sound receiving point arranged in a specific acoustic space with a simple instructive operation when reproducing the acoustic space in real time. It is also the object of the present invention to provide a reverberation imparting program for instructing a computer to function as the reverberation imparting apparatus.

In order to achieve the object, according to the first aspect of the present invention, there is provided a reverberation apparatus for creating an acoustic effect of an acoustic space which is arranged under an instruction of a user with a sound generating point for generating a sound and a sound receiving point for receiving the sound which travels from the sound generating point to the sound receiving point through sound ray paths within the acoustic space, and for applying the created acoustic effect to an audio signal representative of the sound. The inventive reverberation apparatus comprises a storage section that stores a directional characteristic representing a directivity of the generated sound at the sound generating point, a position determining section that determines a position of the sound generating point within the acoustic space on the basis of the instruction from the user, an orientation determining section that determines an orientation of the sound generating point based on the position determined by the position determining section, an impulse response determining section that determines an impulse response for each of the sound ray paths along which the sound emitted from the sound generating point travels to reach the sound receiving point, in accordance with the directional characteristic of the generated sound stored in the storage section and the orientation of the sound generating point determined by the orientation determining section, and a calculation section that performs a convolution operation between the impulse response determined by the impulse response determining section and the audio signal so as to apply thereto the acoustic effect.

According to this structure, the orientation of the sound generating point is derived from its position. In other words, since the orientation of the sound generating point is automatically determined (regardless of the presence or absence of instructions from the user), the user does not need to instruct both the position and orientation of the sound generating point.

Preferably in the present invention, the orientation determining section identifies a direction to a given target point from the sound generating point at the position determined by the position determining section, and determines the orientation of the sound generating point in terms of the identified direction from the sound generating point to the target point. Alternately, the orientation determining section identifies a first direction to a given target point from the sound generating point at the position determined by the position determining section, and determines the orientation of the sound generating point in terms of a second direction making a predetermined angle with respect to the identified first direction.

For example, the orientation determining section sets the target point to the sound receiving point in accordance with the instruction by the user. By such a construction, it is possible to reproduce, without requiring the user to perform a complicated operation, an acoustic space in which the sound generating point or the sound receiving point moves in such a manner that the sound generating point always faces the sound receiving point.

Further, the position determining section may determine the position of the sound generating point which moves in accordance with the instruction from the user. The orientation determining section identifies based on the determined position of the sound generating point a progressing direction along which the sound generating point moves, and determines the orientation of the sound generating point in terms of the identified progressing direction. Alternatively, the position determining section determines the orientation of the sound generating point in terms of an angular direction making a predetermined angle with respect to the identified progressing direction. In these cases, it is possible to reproduce a specific acoustic space without requiring the user to perform a complicated input operation. For example, it is possible to reproduce an acoustic space in which a player holding a sound source, i.e., a musical instrument as the sound generating point moves, while pointing the musical instrument at the direction of the movement or a direction at a certain angle with respect to the progressing direction of the movement.

In order to achieve the above-mentioned object, according to the second aspect of the present invention, there is provided a reverberation apparatus for creating an acoustic effect of an acoustic space which is arranged under an instruction of a user with a sound generating point for generating a sound and a sound receiving point for receiving the sound which travels from the sound generating point to the sound receiving point through sound ray paths within the acoustic space, and for applying the created acoustic effect to an audio signal representative of the sound. The inventive reverberation apparatus comprises a storage section that stores a directional characteristic of a sensitivity of the sound receiving point for the received sound, a position determining section that determines a position of the sound receiving point within the acoustic space on the basis of the instruction from the user, an orientation determining section that determines an orientation of the sound receiving point based on the position determined by the position determining section, an impulse response determining section that determines an impulse response for each of the sound ray paths along which the sound emitted from the sound generating point travels to reach the sound receiving point, in accordance with the directional characteristic of the sensitivity for the received sound stored in the storage section and the orientation of the sound receiving point determined by the orientation determining section, and a calculation section that performs a convolution operation between the impulse response determined by the impulse response determining section and the audio signal so as to apply thereto the acoustic effect.

According to this structure, since the orientation of the sound receiving point is automatically determined according to the position thereof, the user does not need to instruct both the position and the orientation of the sound receiving point.

Preferably under the second aspect of the present invention, the orientation determining section identifies a direction to a given target point from the sound receiving point at the position determined by the position determining section, and determines the orientation of the sound receiving point in terms of the identified direction from the sound receiving point to the target point. Alternately, the orientation determining section identifies a first direction to a given target point from the sound receiving point at the position determined by the position determining section, and determines the orientation of the sound receiving point in terms of a second direction making a predetermined angle with respect to the identified first direction. Further, the orientation determining section sets the target point to the sound generating point in accordance with the instruction by the user. Under this structure, it is possible to reproduce, without requiring the user to perform a complicated operation, an acoustic space in which the sound generating point or the sound receiving point moves in such a manner that the sound receiving point always faces the sound generating point.

Furthermore, the position determining section may determine the position of the sound receiving point which moves in accordance with the instruction from the user. The orientation determining section identifies based on the determined position of the sound receiving point a progressing direction along which the sound receiving point moves, and determines the orientation of the sound receiving point in terms of the identified progressing direction. Alternately, the orientation determining section determines the orientation of the sound receiving point in terms of an angular direction making a predetermined angle with respect to the identified progressing direction. In these cases, it is possible to reproduce, without requiring the user to perform a complicated operation, an acoustic space in which the sound receiving point receiving the sound emitted from the sound generating point moves, while changing its orientation according to the progressing direction of the movement of the sound receiving point.

The present invention can also be applied to a program for instructing a computer to function as the reverberation apparatus described in the first or second aspect of the present invention. This program may be provided to the computer through a network, or in the form of a recording medium typified by an optical disk so that the program will be installed on the computer.

BRIEF DESCRIPTION OF THE DRAWINGS

FIG. 7 shows the contents of a recipe file RF.

FIG. 8 shows the contents of a sound ray path information table TBL1.

FIG. 10 shows the contents of a composite sound ray table TBL2.

FIG. 11 is a table for explaining reproduction channel information.

DETAILED DESCRIPTION OF THE INVENTION

Referring to the accompanying drawings, embodiments of the present invention will be described below.

A

First Embodiment

A-1

Structure of Embodiment

Figure 1:
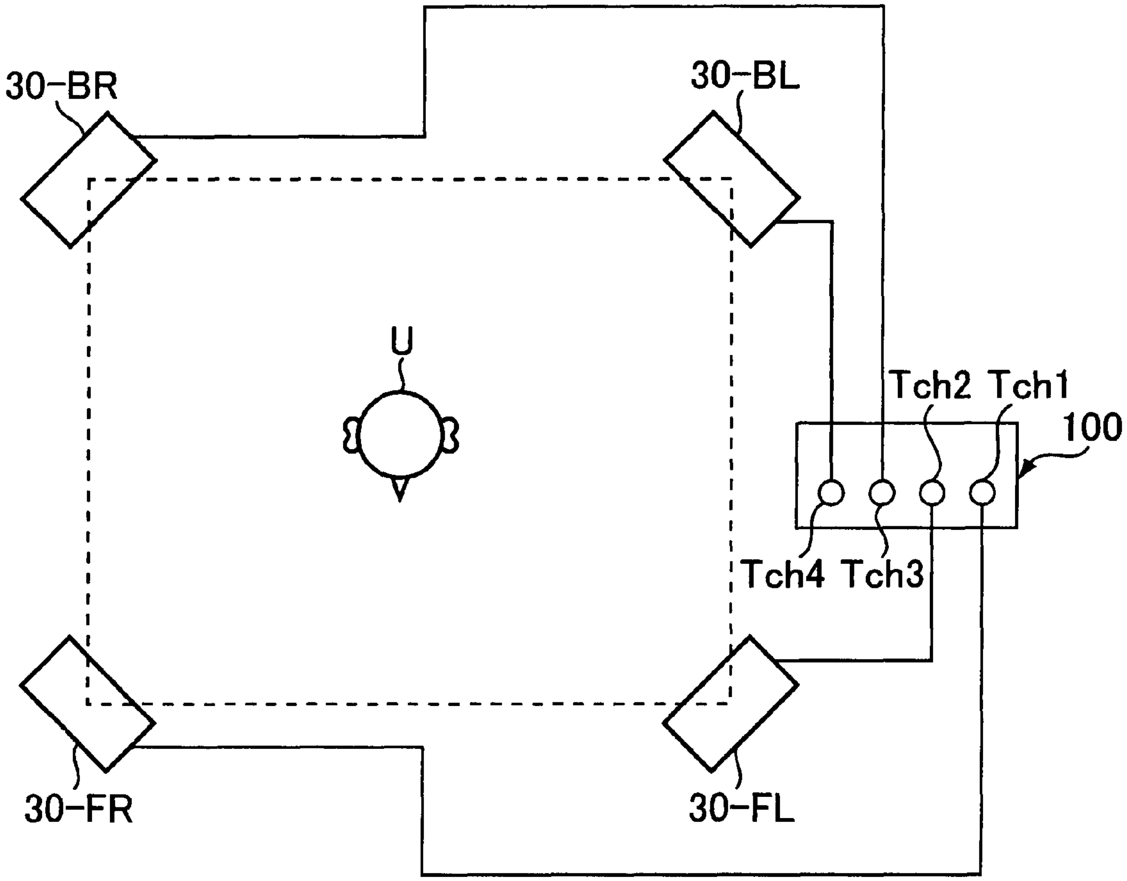
FIG. 1 is an illustration for explaining the state of using a reverberation imparting apparatus according to an embodiment of the present invention.

FIG. 1 shows an outline of using a reverberation imparting apparatus according to an embodiment of the present invention. This reverberation imparting apparatus 100 is designed to impart an acoustic effect of a specific acoustic space to sound to be listened to by a user. The sound imparted with the acoustic effect is reproduced through four reproduction channels. In other words, the reverberation imparting apparatus 100 is provided with four reproduction channel terminals Tch1, Tch2, Tch3, and Tch4 connected to speakers 30 (30-FR, 30-FL, 30-BR, and 30-BL), respectively. Then the sound is outputted from these speakers 30 so that a sound field in the specific acoustic space will be reproduced in a listening room where the user or listener is. In this case, the sound field contains the arrangement of a sound generating point from which the sound is emitted and a sound receiving point at which the sound emitted from the sound generating point is received.

These speakers 30 are placed in position at almost the same distance from the user U in the listening room. The speaker 30-FR is situated to the right in front of the user U (at the lower left in FIG. 1), and the speaker 30-FL is situated to the left in front of the user U (at the lower right in FIG. 1. These speakers 30-FR and 30-FL emit sound to reach the user U from the front in the specific acoustic space.

On the other hand, the speaker 30-BR is situated to the right behind the user U (at the upper left in FIG. 1), and the speaker 30-BL is situated to the left behind the user U (at the upper right in FIG. 1). These speakers 30-BR and 30-BL emit sound to reach the user U from the rear in the specific acoustic space.

Figure 2:
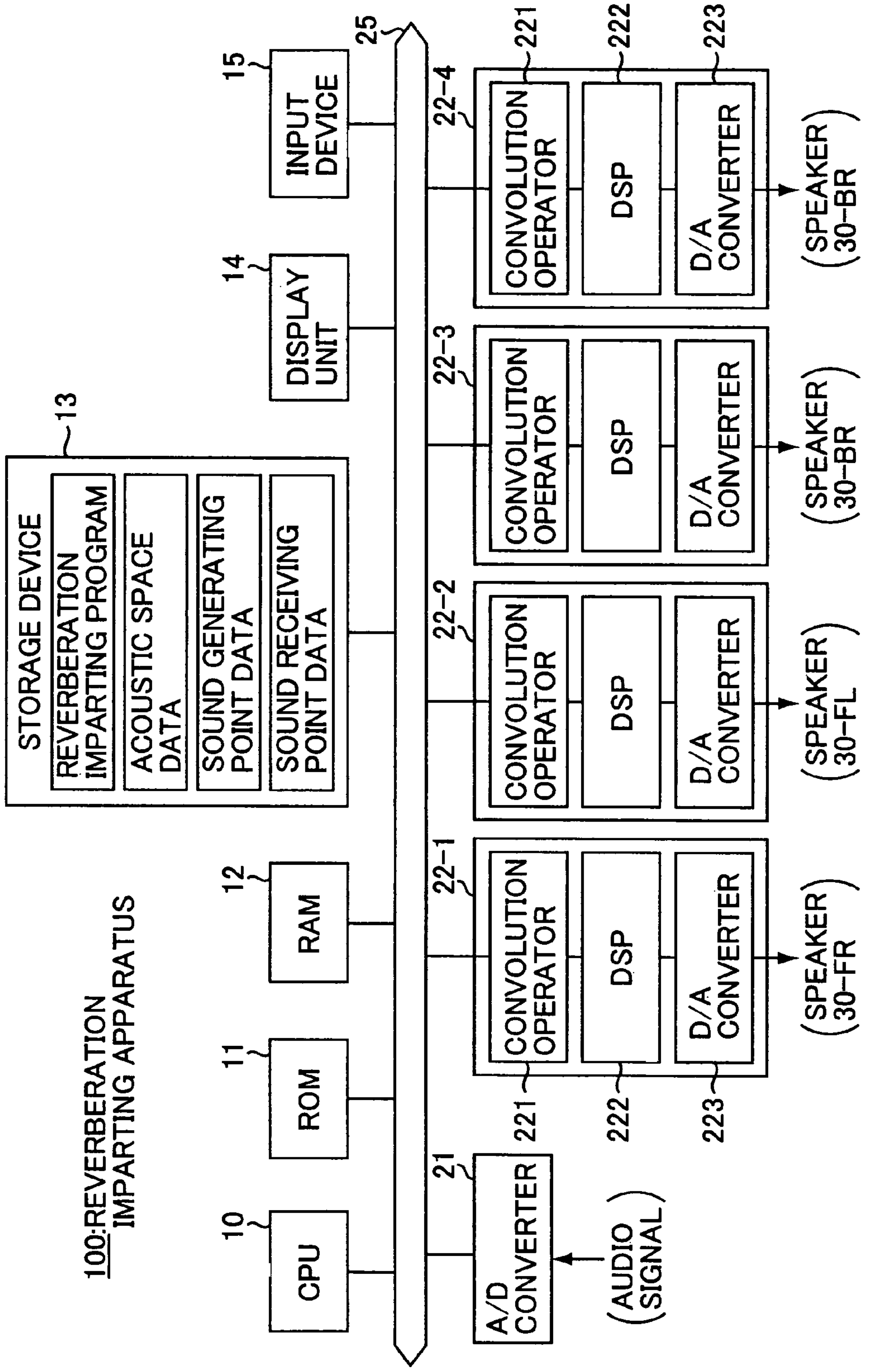
FIG. 2 is a block diagram showing the hardware structure of the reverberation imparting apparatus.

Referring next to FIG. 2, the hardware structure of the reverberation imparting apparatus 100 will be described. As shown, a CPU (Central Processing Unit) 10 is a microprocessor for centralized control of each part of the reverberation imparting apparatus 100. The CPU 10 performs computational operations and control of each part according to a program to achieve various functions. The CPU 10 is connected through a bus 25 with a ROM (Read Only Memory) 11, a RAM (Random Access Memory) 12, a storage device 13, a display unit 14, an input device 15, an A/D (Analog to Digital) converter 21, and four reproduction processing units 22 (22-1, 22-2, 22-3, and 22-4), respectively. The ROM 11 is a nonvolatile memory for storing the program executed by the CPU 10, and the RAM 12 is a nonvolatile memory used as a work area of the CPU 10.

An analog audio signal to be imparted with an acoustic effect is inputted into the A/D converter 21. In order to prevent excess reverberant sound from being contained in the sound reproduced, it is desirable that the audio signal be recorded in an anechoic room so that it will contain a musical tone or voice without any reflected sound (a so-called dry source). The A/D converter 21 converts the input audio signal to a digital audio signal and outputs the same to the bus 25. Note here that the audio signal to be imparted with the acoustic effect may be prestored in the storage device 13 as waveform data indicating the waveform of the signal. Alternatively, the reverberation imparting apparatus 100 may be provided with a communication device for communication with a server so that the communication device will receive waveform data on an audio signal to be imparted with the acoustic effect.

The four reproduction processing units 22 correspond to the four reproduction channels and serve as section for imparting different acoustic effects to audio signals, respectively. Each of the reproduction processing units 22 includes a convolution operator 221, a DSP (Digital Signal Processor) 222, and a D/A (Digital to Analog) converter 223. The convolution operator 221, connected to the bus 25, performs a convolution operation between the impulse response specified by the CPU 10 and the audio signal to be imparted with an acoustic effect. The DSP 222 performs various kinds of signal processing, such as signal amplification, such as signal amplification, time delay, and filtering, on a digital signal obtained by the convolution operation performed by the processor 221 at the preceding stage, and outputs the processed signal. On the other hand, the D/A converter 223 in each reproduction unit 22 is connected to each corresponding speaker 30. Specifically, the D/A converter 223 in the reproduction unit 22-1 is connected to the speaker 30-FR, and the D/A converter 223 in the reproduction unit 22-2 is connected to the speaker 30-FL. Then the D/A converter 223 in the reproduction unit 22-3 is connected to the speaker 30-BR, and the D/A converter 223 in the reproduction unit 22-4 is connected to the speaker 30-BL. Each of these D/A converters 223 converts the digital signal from the preceding DSP 222 to an analog signal and outputs the analog signal to the following speaker 30.

The storage device 13 stores a program executed by the CPU 10 and various kinds of data used for executing the program. Specifically, a disk drive for writing and reading data to and from a recording medium such as a hard disk or CD-ROM can be adopted as the storage device 13. In this case, a reverberation imparting program is stored in the storage device 13. This reverberation imparting program is to impart an acoustic effect to an audio signal. Specifically, this program is executed by the CPU 10 to implement a function for determining an impulse response corresponding to an acoustic space to be reproduced, a function for instructing the convolution operator 221 on the impulse response determined, and so on.

The storage device 13 also stores acoustic space data, sound generating point data, and sound receiving point data as data to be used in calculating the impulse response according to the reverberation imparting program. The acoustic space data indicates the condition of an acoustic space to be reproduced, and is prepared for each of multiple acoustic spaces such as a concert hall, a church, and a theater. One kind of acoustic space data includes space shape information and reflecting characteristics. The space shape information indicates the shape of the acoustic space targeted by the acoustic space data, designating the positions of the walls, the ceiling, the floor, etc. as coordinate information in the XYZ orthogonal coordinate system. On the other hand, the reflecting characteristics specify the sound reflecting characteristics (sound absorption coefficient, angle of sound reflection, etc.) on the boundary surface such as the walls, the ceiling, and the floor in the acoustic space.

The sound generating point data is data related to a sound generating point arranged in the acoustic space, and prepared for each of possible objects as sound sources such as a piano, a trumpet, and a clarinet. One kind of sound generating point data includes the directional characteristics of the sound generating point. The directional characteristic of the sound generating point represents a directivity of the generated sound at the sound generating point. More specifically, the directivity of the generated sound represents an angular distribution of the intensity or magnitude of the sound generated from the sound source. The intensity or magnitude of the generated sound normally depends on diverging directions from the sound generating point. The diverging directions may be determined with respect to the orientation of the sound generating point. Typically, the intensity of the generated sound becomes maximal in the diverging or outgoing direction coincident to the orientation of the sound generating point.

On the other hand, the sound receiving point data is data related to a sound receiving point arranged in the acoustic space. For example, it is prepared for each of possible objects as sound receiving points such as a human being and a microphone. One kind of sound receiving point data includes the directional characteristic of the sound receiving point. The directional characteristic of the sound receiving point represents a sensitivity of the sound receiving point for the received sound. The sensitivity of the sound receiving point varies dependently on converging directions to the sound receiving point with respect to the orientation of the sound receiving point. Typically, the sensitivity of the microphone may become maximal in the converging or incoming direction coincident to the orientation of the sound receiving point.

In the embodiment, various kinds of acoustic space data, sound generating point data, and sound receiving point data are stored in the storage device 13 so that the user can select from among multiple candidates which kind of acoustic space or musical instrument as a sound generating point he or she desires. The storage device 13 needs not necessarily to be built in the reverberation imparting apparatus 100; it may be externally connected to the reverberation imparting apparatus 100. Further, the reverberation imparting apparatus 100 needs not necessarily include the storage device 13. For example, the reverberation imparting apparatus 100 may be provided with a device for communication with a networked server so that the acoustic space data, the sound generating point data, and the sound receiving point data will be acquired from the server, respectively.

The display unit 14 includes a CRT (Cathode Ray Tube) or liquid crystal display panel; it renders various images under the control of the CPU 10. The input device 15 is, for example, a keyboard and a mouse, or a joystick; it outputs to the CPU 10 a signal indicating the contents of user's operation. Prior to reproduction of an acoustic space, the user can operate the input device 15 at his or her discretion to specify an acoustic space to be reproduced, kinds of sound generating point and sound receiving point, and the positions of the sound generating point and the sound receiving point in the acoustic space. In the embodiment, the user can also operate the input device 15 during reproduction of the acoustic space (that is, while sound is being outputted from the speakers 30) to move the position of the sound generating point or the sound receiving point in the acoustic space at his or her discretion. The CPU 10 calculates an impulse response based on not only the condition of the acoustic space corresponding the acoustic space data, but also various other parameters, such as the directional characteristics of the sound generating point indicated by the sound generating point data, the directional characteristics of the sound receiving point indicated by the sound receiving point data, and the positions and directions of the sound generating point and the sound receiving point.

A-2

Operation Mode

Figure 3:
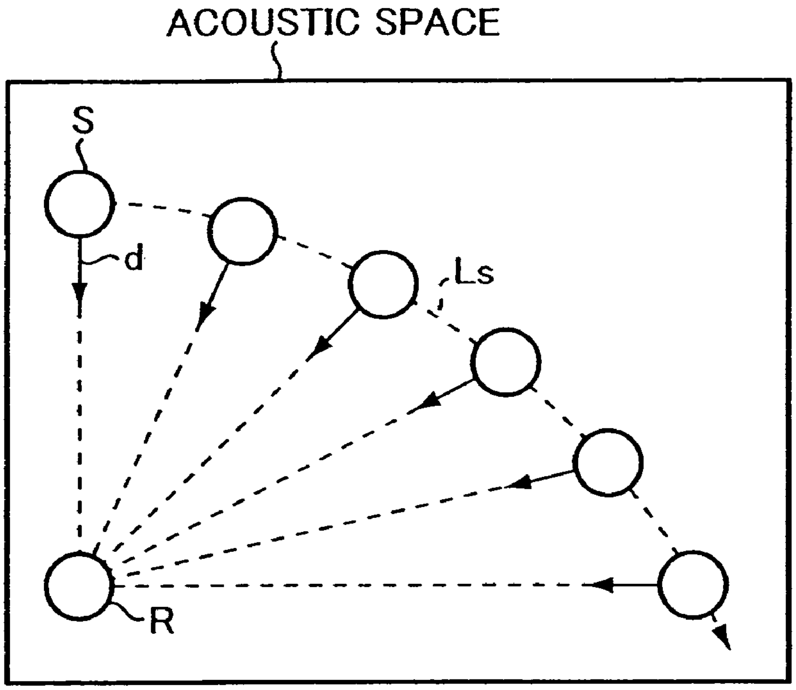
FIGS. 3(*a*) and 3(*b*) are an illustration for explaining a first operation mode.
Figure 3:
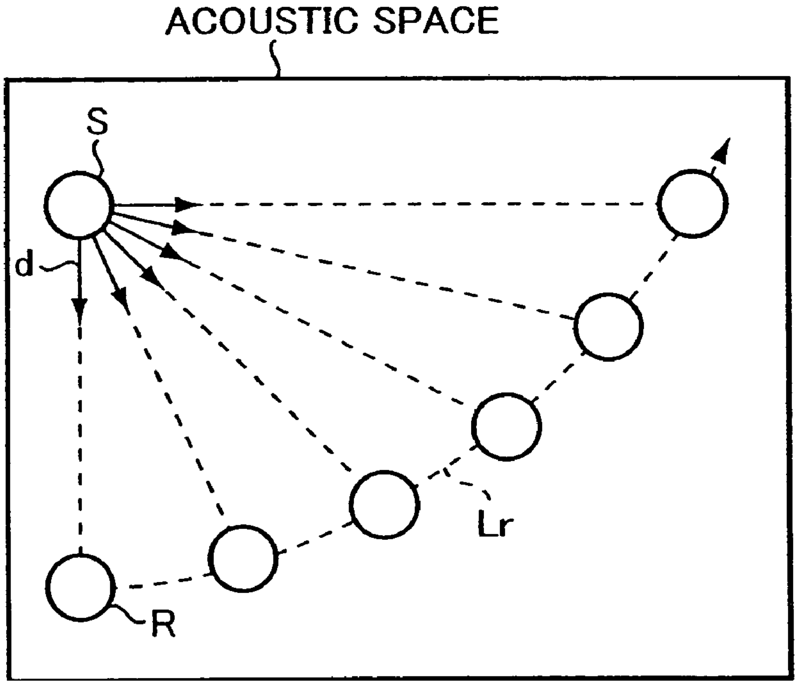
Figure 4:
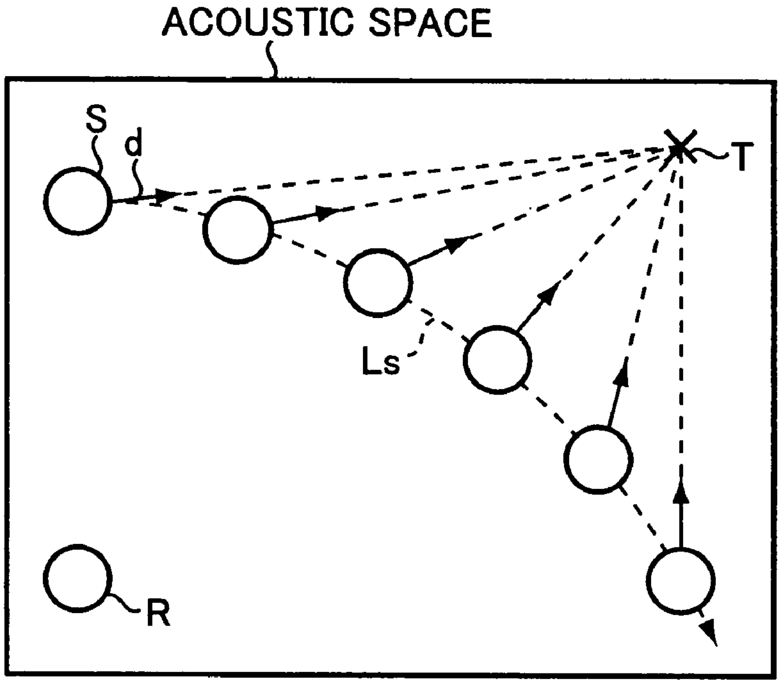
FIGS. 4(*a*) and 4(*b*) are an illustration for explaining a second operation mode.
Figure 4:
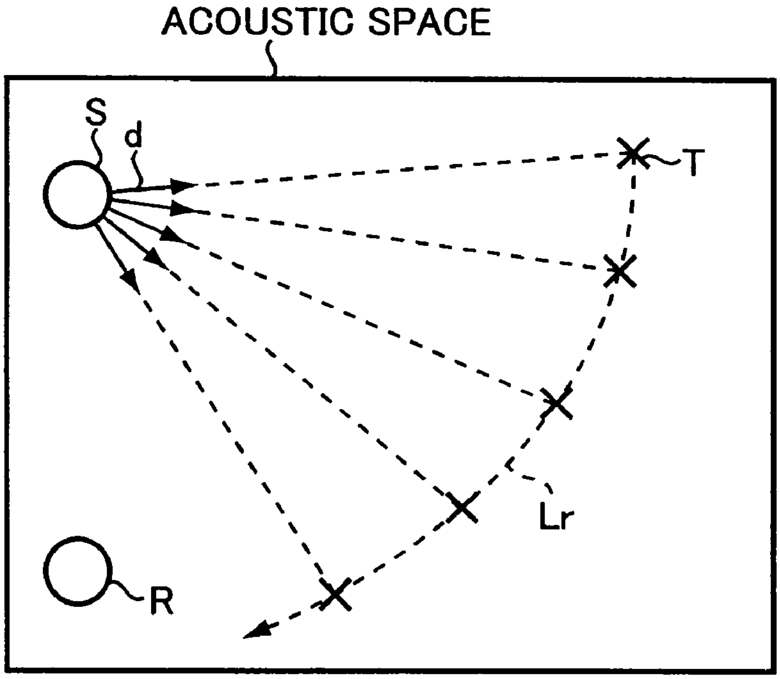
Figure 5:
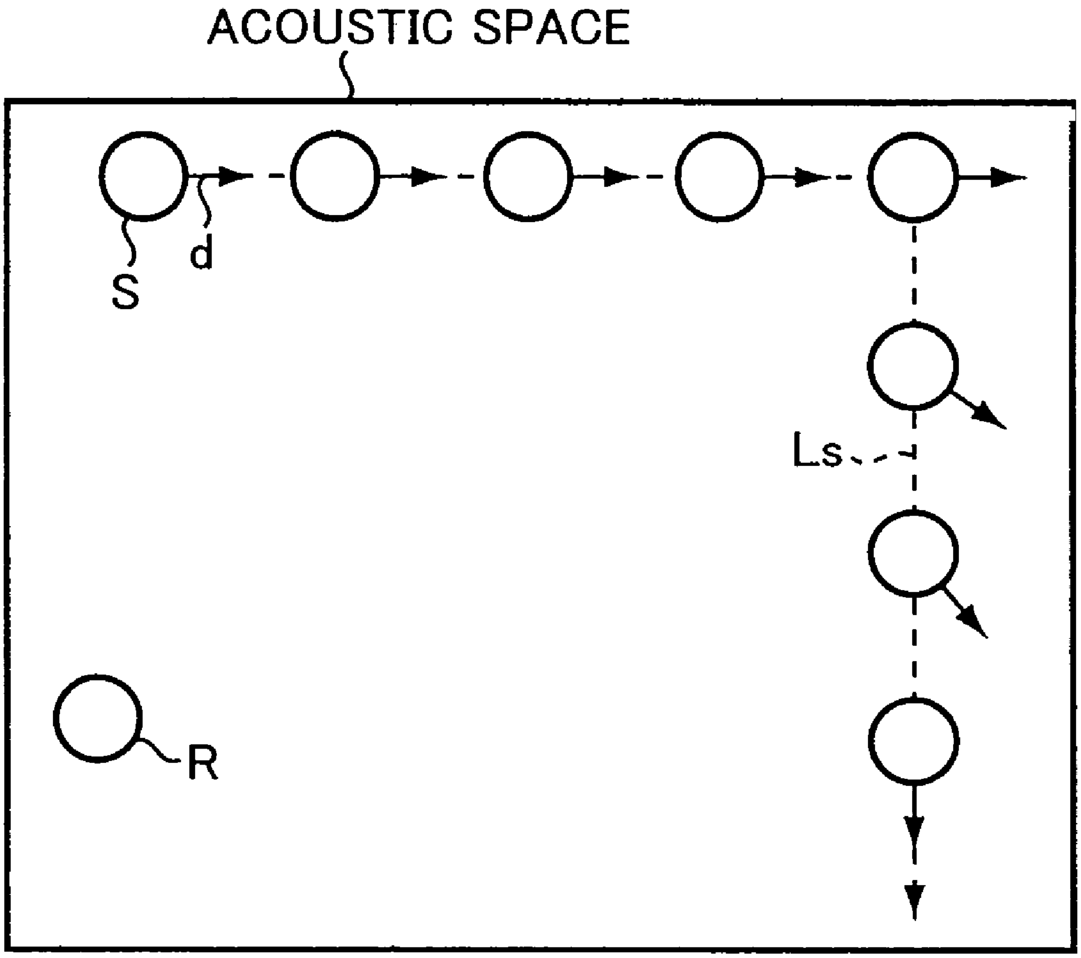
FIG. 5 is an illustration for explaining a third operation mode.

In the embodiment, the CPU 10 determines the direction of a sound generating point based on the position of the sound generating point specified by the user. The way of determining the orientation of the sound generating point from its position varies according to the operation mode selected by the user prior to reproduction of the acoustic space. In the embodiment, three operation modes, namely the first to third operation modes, are prepared. Referring to FIGS. 3 to 5, a description will be made of how to determine the direction of a sound generating point in each operation mode. Although an actual acoustic space is three-dimensional, the description will be made by taking only the bottom surface into account for convenience in explaining to see the relationship between the acoustic space and the sound generating point or the sound receiving point as a two-dimensional relationship. In these figures, the orientation of the sound generating point is represented as a diagrammatically shown unit vector d.

[1] First Operation Mode

FIGS. 3(*a*) and 3(*b*) show the directions of a sound generating point when the first operation mode is selected. FIG. 3(*a*) assumes that a sound generating point S is moved along a dashed line Ls in an acoustic space, while FIG. 3(*b*) assumes that a sound receiving point R is moved along a dashed line Lr in the acoustic space. As shown in these figures, when the first operation mode is selected, the orientation of the sound receiving point R as viewed from the sound generating point S is identified as the orientation of the sound generating point S. Specifically, the CPU 10 determines a unit vector di, for example, based on equation (1) shown below, where "i" is a variable representing the point of time when the orientation of the sound generating point S is determined.

$$\vec{d}_i = \frac{\vec{r}_i - \vec{s}_i}{|\vec{r}_i - \vec{s}_i|} \quad (1)$$

where $|\vec{r}_i - \vec{s}_i|>0$ $\vec{d}_i$: the unit vector indicating the orientation of the sound generating point $\vec{s}_i$: the position vector of the sound generating point $\vec{r}_i$: the position vector of the sound receiving point

[2] Second Operation Mode

When selecting the second operation mode, the user designates a target point at a position different from those of the sound generating point and the sound receiving point in the acoustic space. FIGS. 4(*a*) and 4(*b*) show the directions of the sound generating point when the second operation mode is selected. FIG. 4(*a*) assumes that the sound generating point S is moved along the dashed line Ls in the acoustic space, while FIG. 4(*b*) assumes that a target point T is moved along a dashed line Lt in the acoustic space. As shown in these figures, when the second operation mode is selected, the direction of the target point T as viewed from the sound generating point S is identified as the orientation of the sound generating point S. Specifically, the CPU 10 determines the unit vector di, for example, based on the following equation (2):

$$\vec{d}_i = \frac{\vec{t}_i - \vec{s}_i}{|\vec{t}_i - \vec{s}_i|} \quad (2)$$

where $|\vec{t}_i - \vec{s}_i|>0$ $\vec{t}_i$: the position vector of the target point

[3] Third Operation Mode

FIG. 5 shows the orientation of the sound generating point when the third operation mode is selected. FIG. 5 assumes that the sound generating point S is moved along the dashed line Ls in the acoustic space. As shown in FIG. 5, when the third operation mode is selected, the direction of movement of the sound generating point S is identified as the orientation of the sound generating point S. Specifically, the CPU 10 determines the unit vector di, for example, based on equation (3) shown below. In this equation, the coefficient T is a coefficient representing the speed at which the orientation of the sound generating point S gets close to its direction of movement (hereinafter called the "asymptotic rate coefficient"). The larger the coefficient T, the shorter the time period in which it comes to matching the orientation of the sound generating point S with its direction of movement. The asymptotic rate coefficient T can be set infinitely large so that as the direction of movement of the sound generating point S is changed, the orientation of the sound generating point S becomes the direction of movement after changed.

$$\vec{d}_i = \frac{\vec{d}_{i-1} + \vec{v}_i \cdot T}{|\vec{d}_{i-1} + \vec{v}_i \cdot T|} \quad (3)$$

where $|\vec{d}_{i-1}+\vec{v}_i \cdot T|>0$ $\vec{v}_i$: the rate vector of the sound generating point T: the asymptotic rate coefficient

A-3

Operation of Embodiment

Figure 6:
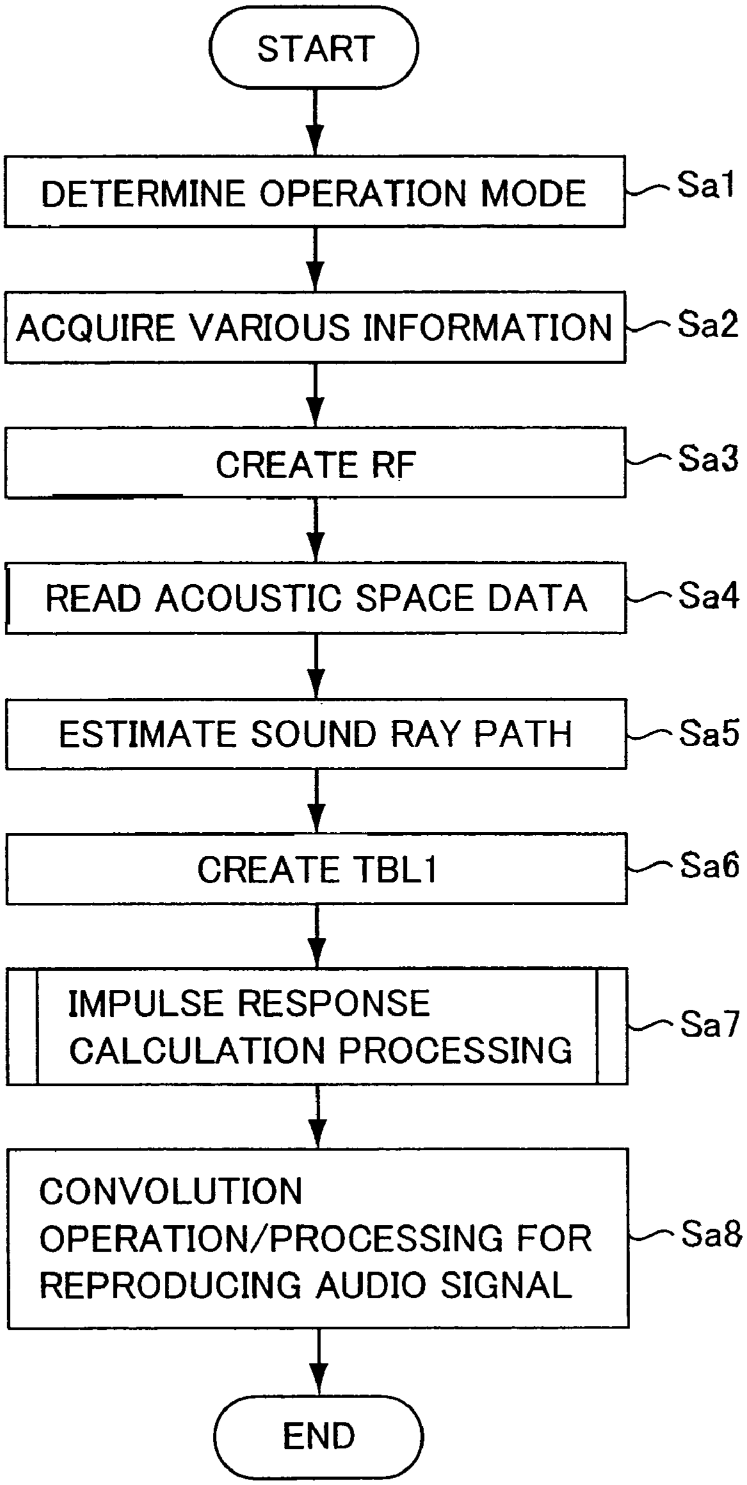
FIG. 6 is a flowchart showing the processing performed by a CPU in the reverberation imparting apparatus.
Figure 9:
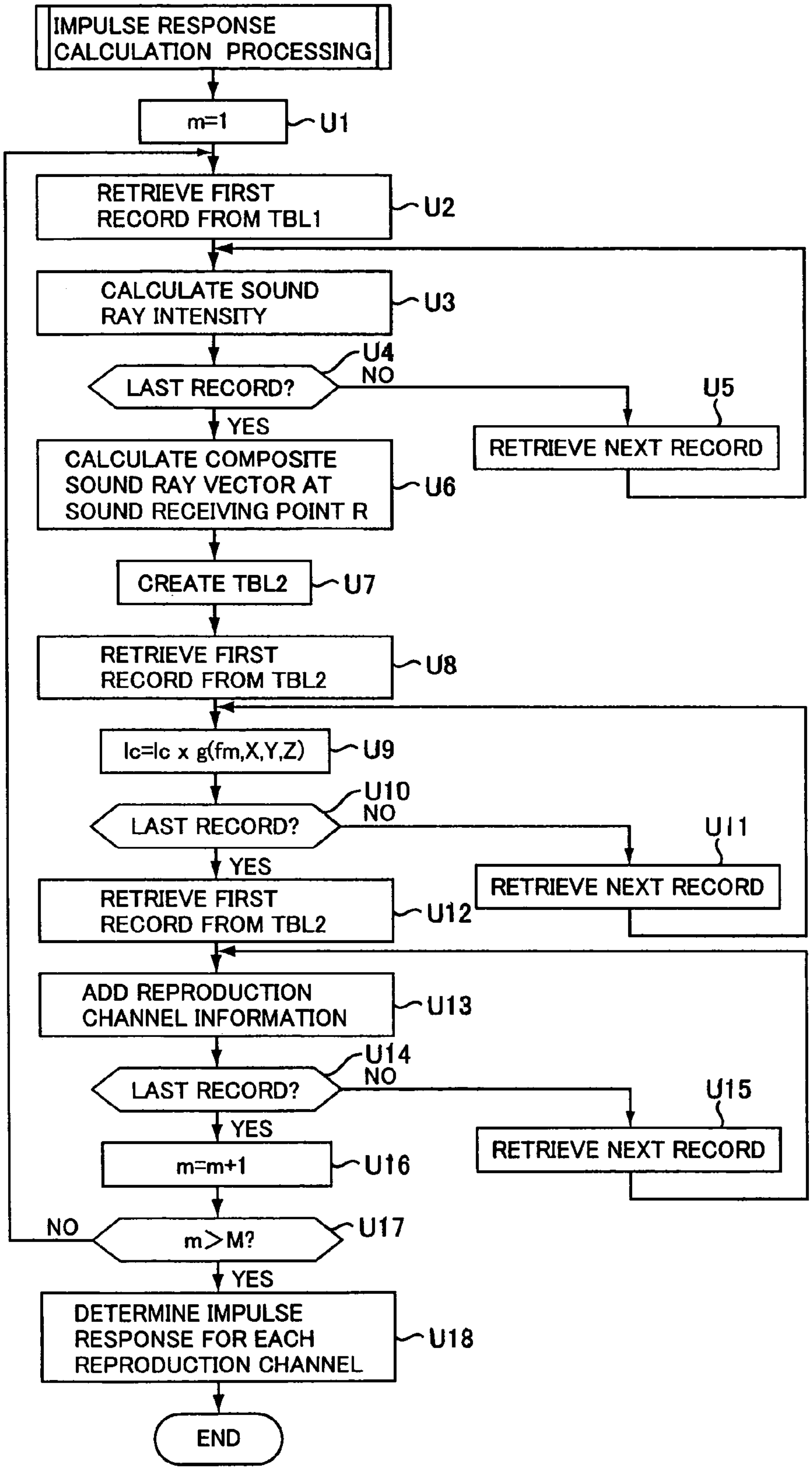
FIG. 9 is a flowchart showing the procedure of impulse response calculation processing performed by the CPU in the reverberation imparting apparatus.
Figure 12:
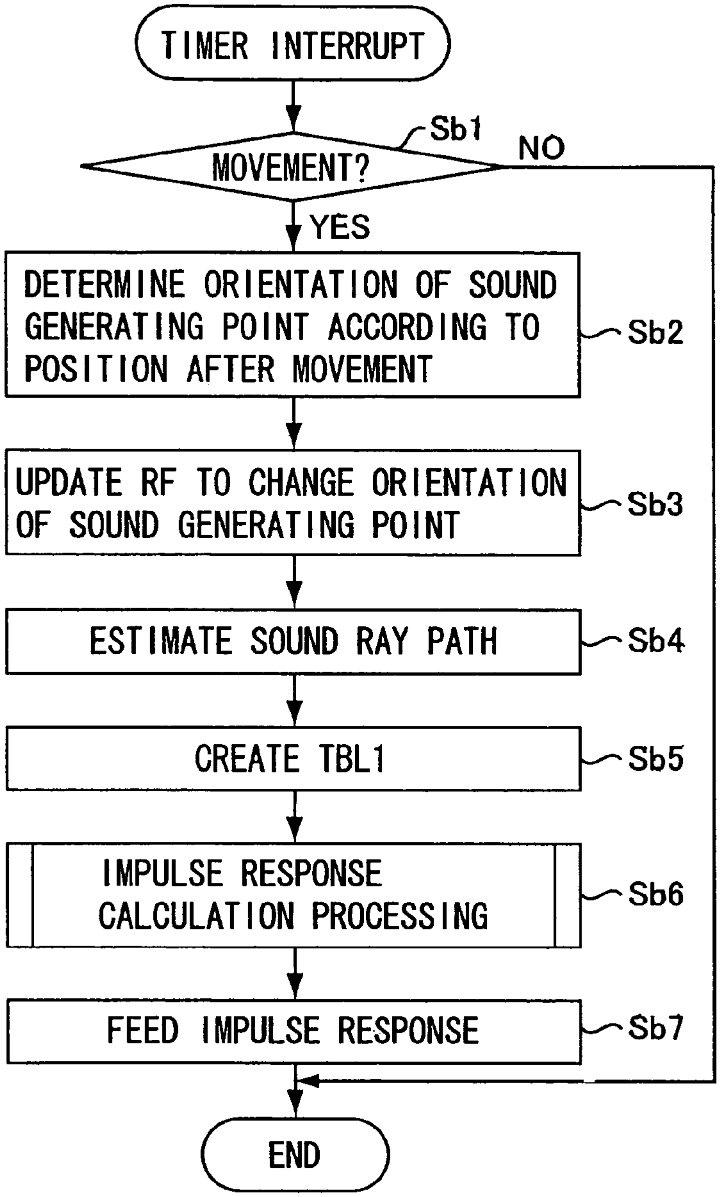
FIG. 12 is a flowchart showing the procedure of timer interrupt processing performed by the CPU in the reverberation imparting apparatus.

The operation of the embodiment will next be described. When the user operates the input device 15 to instruct the start of the reproduction of an acoustic space, the CPU 10 reads the reverberation imparting program from the storage device 13 into the RAM 12, and executes the program sequentially. FIGS. 6, 9 and 12 are flowcharts showing the flow of processing or operations according to the reverberation imparting program. A sequence of operations shown in FIG. 6 are performed immediately after the start of the execution of the reverberation imparting program. Then, after completion of the sequence of operations shown in FIG. 6, processing shown in FIG. 12 is performed at regular time intervals by a timer interrupt.

[1] Processing Immediately After Start of Execution (FIG. 6)

When starting the reverberation imparting program, the CPU first determines the operation mode selected by the user according to the contents of user's operation of the input device 15 (step Sa1). Then the CPU determines the kind of acoustic space, the kind and position of the sound generating point S, the kind, position, and orientation of the sound receiving point R according to the contents of the user's operation of the input device 15 (step Sa2). When the second operation mode is selected, the CPU 10 determines at step Sa2 the position of the target point T according to the user's operation. It is assumed here that each piece of information is determined according to the instructions from the user, but these pieces of information may be prestored in the storage device 13.

Then, the CPU 10 creates a recipe file RF including each piece of information determined at step Sa2 and stores the same in the RAM 12 (step Sa3). FIG. 7 shows the specific contents of the recipe file RF. In FIG. 7, the "position of target Point" field is enclosed with a dashed box because it is included in the recipe file RF only when the second operation mode is selected. As shown, the position of the sound generating point S, and the position and orientation of the sound receiving point R (and further the position of the target point T in the second operation mode) are included in the recipe file RF as coordinate information in the XYZ orthogonal coordinate system.

As shown in FIG. 7, the orientation of the sound generating point S is included in the recipe file RF in addition to the parameters determined at step Sa2. For the orientation of the sound generating point S, an initial value corresponding to the operation mode selected at step Sa1 is set. In other words, when the first operation mode is selected, the CPU 10 identifies the orientation of the sound receiving point R as viewed from the position of the sound generating point S as an initial value of the orientation of the sound generating point S, and includes it in the recipe file RF. When the second operation mode is selected, the CPU 10 includes the direction of the target point T as viewed from the position of the sound generating point S in the recipe file RF as an initial value of the orientation of the sound generating point S. When the third operation is selected, the CPU 10 includes a predetermined direction in the recipe file RF as an initial value of the sound generating point S.

Next, the CPU 10 reads acoustic space data corresponding to the acoustic space included in the receipt file RF from the storage device 13 (step Sa4). The CPU 10 then determines a sound ray path, along which sound emitted from the sound generating point S travels until it reaches the sound receiving point R, based on the space shape indicated by the read-out acoustic space data, and the positions of the sound generating point S and the sound receiving point R included in the recipe file RF (step Sa5). In step Sa5, the sound ray path is determined on the assumption that the emission characteristics of the sound generating point S is independent of the direction from the sound generating point S. In other words, the sound is emitted in all directions at almost the same level, and among others the paths of sound rays that reach the sound receiving point R after reflected on the wall surfaces and/or the ceiling. Various known techniques, such as a sound-ray method or mirror image method, can be adopted in determining the sound ray path.

Subsequently, the CPU 10 creates a sound ray path information table TBL1 as illustrated in FIG. 8 based on each of the sound ray paths determined at step Sa5 (step Sa6). The sound ray path information table TBL1 lists multiple records corresponding to the respective sound ray paths determined at step Sa5 in order from the shortest path length to the longest path length. As shown in FIG. 8, a record corresponding to one sound ray path includes the path length of the sound ray path concerned, the emitting direction from the sound generating point S, the direction to reach the sound receiving point R, the number of reflections on the wall surfaces, and a reflection attenuation rate. The emitting direction and the reaching direction are represented as vectors in the XYZ orthogonal coordinate system. The number of reflections indicates the number of times the sound ray is reflected on the wall surfaces or ceiling in the sound ray path. Further, the reflection attenuation rate denotes the rate of sound attenuation resulting from one or more reflections indicated by the number of reflections.

Next, the CPU 10 determines an impulse response for each reproduction channel based on the recipe file RF shown in FIG. 7 and the sound ray path information table TBL1 shown in FIG. 8 (step Sa7). After that, the CPU 10 instructs to perform a convolution operation between the impulse response determined at step Sa7 and an audio signal and perform processing for reproducing the audio signal (step Sa8). In other words, the CPU 10 outputs, to the convolution operator 221 of each corresponding reproduction processing unit 22, not only the impulse response determined for each corresponding reproduction channel, but also a command to instruct the convolution operator 221 to perform a convolution operation between the impulse response and the audio signal.

The command from the CPU 10 triggers the convolution operator 221 of each corresponding reproduction processing unit 22 to perform a convolution operation between the audio signal supplied from the A/D converter 21 and the impulse response received from the CPU 10. The audio signal obtained by the convolution operation is subjected to various kinds of signal processing by the DSP 222, and converted to an analog signal at the following D/A converter 223. Finally each speaker 30 outputs sound corresponding to the audio signal supplied from the preceding D/A converter 223.

[2] Processing for Calculating Impulse Response (FIG. 9)

Referring next to FIG. 9, the procedure of processing when an impulse response is determined at step Sa7 in FIG. 6 will be described. Various parameters such as the directional characteristics of the sound generating point S used in determining the impulse response have frequency dependence. Therefore, the CPU 10 divides the frequency band for impulse responses into smaller frequency sub-bands within which the parameters remain substantially constant, and determines an impulse response in each sub-band. In the embodiment, the frequency band for impulse responses is divided into M sub-bands.

As shown in FIG. 9, the CPU 10 first initializes a variable m for specifying a sub-band to "1" (step U1). The CPU then determines a sound ray intensity I of sound that travels along the sound ray path and reaches the sound receiving point R. Specifically, the CPU 10 retrieves the first record from the sound ray path information table TBL1 (step U2), and determines the sound ray intensity I for each sound ray path in a band fm from the emitting direction and the reflection attenuation rate included in the record, and the directional characteristics indicated by the sound generating point data corresponding to the sound generating point S according to the following equation (step U3):

$$I=(r\hat{}2/L\hat{}2)\times\alpha(fm)\times d(fm,X,Y,Z)\times\beta(fm,L)$$

where the operator "^" represents the power, r is the reference distance, L the sound ray path length, a(fm) the reflection attenuation rate, d(fm, X, Y, Z) the sounding directivity attenuation coefficient, and β(fm, L) the distance attenuation coefficient. The reference distance r is set according to the size of the acoustic space to be reproduced. Specifically, when the length of the sound ray path is large enough with respect to the size of the acoustic space, the reference distance r is so set as to increase the attenuation rate of the sound that travels along the acoustic ray path. The reflection attenuation rate a(fm) is an attenuation rate determined according to the number of sound reflections on the walls or the like in the acoustic space as discussed above. Since the sound reflectance is dependent on the frequency of the sound to be reflected, the reflection attenuation rate a is set on a band basis. Further, the distance attenuation coefficient β(fm, L) represents an attenuation rate in each band corresponding to the sound travel distance (path length).

On the other hand, the sounding directivity attenuation coefficient d(fm, X, Y, Z) is an attenuation coefficient determined according to the directional characteristics and orientation of the sound generating point S. Since the directional characteristics of the sound generating point S varies with frequency band of the sound to be emitted, the sounding directivity attenuation coefficient d is dependent on the band fm. Therefore, the CPU 10 reads from the storage device 13 sound generating point data corresponding to the kind of sound generating point S included in the recipe file RF, and corrects the directional characteristics indicated by the sound generating point data according to the orientation of the sound generating point S included in the recipe file RF to determine the sounding directivity attenuation coefficient d(fm, X, Y, Z). As a result, the sound ray intensity I weighted by the sounding directivity attenuation coefficient d(fm, X, Y, Z) reflects the directional characteristics and orientation of the sound generating point S.

Next, the CPU 10 determines whether the record processed at step U3 is the last record in the sound ray path information table (step U4). If determining that it is not the last record, the CPU 10 retrieves the next record from the sound ray path information table TBL1 (step U5) and returns to step U3 to determine the sound ray intensity I for an acoustic ray path stored in this record.

On the other hand, if determining that it is the last record, then the CPU 10 determines a composite sound ray vector at the sound reception point R (step U6). In other words, the CPU 10 retrieves records of sound ray paths that reach the sound reception point R in the same time period, that is, that have the same sound ray path length, from the sound ray path information table TBL1 to determine the composite sound ray vector from the reaching direction and the sound ray intensity included in each of these records.

Next, the CPU 10 creates a composite sound ray table TBL2 from the composite sound ray vector determined at step U6 (step U7). FIG. 10 shows the contents of the composite sound ray table TBL2. As shown in FIG. 10, the composite sound ray table TBL2 contains multiple records corresponding to respective composite sound ray vectors determined at step U6. A record corresponding to one composite sound ray vector includes a reverberation delay time, a composite sound ray intensity, and a composite reaching direction. The reverberation delay time indicates time required for the sound indicated by the composite sound ray vector to travel from the sound generating point S to the sound receiving point R. The composite sound ray intensity indicates the intensity of the composite sound ray vector. The composite reaching direction indicates the direction of the composite sound ray to reach the sound receiving point R, and is represented by the direction of the composite sound ray vector.

Next, the CPU 10 weights the composite sound ray intensity of each composite sound ray vector determined at step U6 with the directional characteristics and orientation of the sound receiving point R. Specifically, the CPU 10 retrieves the first record from the composite sound ray table TBL2 (step U8), multiplies the composite sound ray intensity included in the record by a sound receiving directivity attenuation coefficient g(fm, X, Y, Z), and then writes the results over the corresponding composite sound ray intensity in the composite sound ray table TBL2 (step U9). The sound receiving directivity attenuation coefficient g(fm, X, Y, Z) is an attenuation coefficient corresponding to the directional characteristics and orientation of the sound receiving point R. Since the directional characteristics of receiving sound at the sound receiving point R varies with frequency band of the sound to reach the sound receiving point R, the sound receiving directivity attenuation coefficient g is dependent on the band fm. Therefore, the CPU 10 reads from the storage device 13 sound receiving point data corresponding to the kind of sound receiving point R included in the recipe file RF, and corrects the directional characteristics indicated by the sound receiving point data according to the orientation of the sound receiving point R included in the recipe file RF to determine the sound receiving directivity attenuation coefficient g(fm, X, Y, Z). As a result, the sound ray intensity Ic weighted by the sound receiving directivity attenuation coefficient g(fm, X, Y, Z) reflects the directional characteristics and orientation of the sound receiving point R.

Next, the CPU 10 determines whether all the records in the composite sound ray table TBL2 have been processed at step U9 (step U10). If determining that any record has not been processed yet, the CPU 102 retrieves the next record (step U11) and returns to step U9 to weight the composite sound ray intensity for this record.

If determining that the all the records have been processed at step U10, the CPU 10 performs processing for determining which of four speakers 30 outputs sound corresponding to the composite sound ray vector and assigning the composite sound ray vector to each speaker.

In other words, the CPU 10 first retrieves the first record from the composite sound ray table TBL2 (step U12) (see TBL2 in FIG. 11). The CPU 10 then determines one or more reproduction channels through which the sound corresponding to the composite sound ray vector should be outputted. If determining two or more reproduction channels, then the CPU 10 determines a loudness balance of sounds to be outputted through respective reproduction channels. After that, the CPU 10 adds reproduction channel information representing the determination results to each corresponding record in the composite sound ray table TBL2 (step U13). For example, when the composite reaching direction in the retrieved record indicates arrival from the right front to the sound receiving point R, the sound corresponding to the composite sound ray vector needs to be outputted from the speaker 30-FR situated to the right in front of the listener. For this purpose, the CPU 10 adds reproduction channel information indicating the reproduction channel corresponding to the speaker 30-FR (see FIG. 9). Further, when the reaching direction of the composite sound ray vector indicates arrival from the front to the sound receiving point R, the CPU 10 adds reproduction channel information that instructs the speaker 30-FR and the speaker 30-FL to output the sound corresponding to the composite sound ray vector at the same loudness level.

Next, the CPU 10 determines whether all the records in the composite sound ray table TBL2 have been processed at step U13 (step U14). If determining that any record has not been processed yet, the CPU 10 retrieves the next record (step U15) and returns to step U13 to add reproduction channel information to this record.

On the other hand, if determining that all the records have been processed at step U13, the CPU 10 increments the variable m by "1" (step U16) and determines whether the variable is greater than the number of divisions M for the frequency band (step U17). If determining that the variable m is equal to or smaller than the number of divisions M, the CPU 10 returns to step U2 to determine an impulse response for the next sub-band.

On the other hand, if determining that the variable m is greater than the number of divisions M, that is, when processing for all the sub-bands is completed, the CPU 10 determines an impulse response for each reproduction channel from the composite sound ray intensity Ic determined for each sub-band (step U18). In other words, the CPU 10 refers to the reproduction channel information added at step U13, and retrieves records for composite sound ray vectors assigned to the same reproduction channel from the composite sound ray table TBL2 created for each sub-band. The CPU 102 then determines impulse sounds to be listened to at the sound receiving point R on a time-series basis from the reverberation delay time and the composite sound ray intensity of each of the retrieved records. Thus the impulse response for each reproduction channel is determined, and used in the convolution operation at step Sa8 in FIG. 6.

[3] Timer Interrupt Processing (FIG. 12)

Referring next to FIG. 12, the procedure of processing performed in response to a timer interrupt will be described.

After the start of the reproduction of an acoustic space, the user can operate the input device 15 at his or her discretion while viewing images (images shown in FIGS. 3 to 5) displayed on the display unit 14 to change the position of the sound generating point S or the sound receiving point R, or the position of the target point T when the second operation mode is selected. On the other hand, when a timer interrupt occurs, the CPU 10 determines whether the user instructs the movement of each point (step Sb1). If any point is not moved, the impulse response used in a convolution operation does not need changing. In this case, the CPU 10 ends the timer interrupt processing without performing steps Sb2 to Sb7.

On the other hand, if determining that any point is moved, the CPU 10 uses any one of the aforementioned equations (1) to (3) corresponding to the selected operation mode to determine the orientation of the sound generating point P according to the position of the moved point (step Sb2). For example, suppose that the sound generating point P is moved in the first operation mode. In this case, the unit vector di representing the orientation of the sound generating point P after the movement is determined based on the equation (1) from the position vector of the sound generating point S after the movement and the position vector of the sound receiving point R included in the recipe file RF. On the other hand, suppose that the sound receiving point R is moved in the first operation mode. In this case, the unit vector di representing the orientation of the sound generating point S after the movement is determined based on the equation (1) from the position vector of the sound receiving point R after the movement and the position vector of the sound generating point S included in the recipe file RF. In the case that the sound generating point P or the target point T is moved in the second operation mode, the unit vector di representing the direction of a new sound generating point S is determined in the same manner based on the equation (2).

On the other hand, in the case that the sound generating point S is moved in the third operation mode, the CPU 10 determines a rate vector v of the sound generating point S from the position vector of the sound generating point S immediately before the movement, the position vector of the sound generating point S after the movement, and time required between the position vectors. The CPU 10 then determines the unit vector di representing the orientation of the sound generating point P after the movement based on the equation (3) from the rate vector v, the unit vector di-1 representing the orientation of the sound generating point S immediately before the movement, and the predetermined asymptotic rate coefficient T.

Next, the CPU 10 updates the recipe file RF to replace not only the position of the moved point with the position after the movement, but also the orientation of the sound generating point S with the direction determined at step Sb2 (step Sb3). The CPU 10 then determines a sound ray path along which sound emitted from the sound generating point S travels until it reaches the sound receiving point R based on the updated recipe file RF (step Sb4). The sound ray path is determined in the same manner as in step Sa5 of FIG. 6. After that, the CPU 10 creates the sound ray path information table TBL1 according to the sound ray path determined at step Sb4 in the same manner as in step Sa6 of FIG. 6 (step Sb5).

Subsequently, the CPU 10 creates a new impulse response for each reproduction channel based on the recipe file RF updated at step Sb3 and the sound ray path information table TBL1 crated at the immediately preceding step Sb5 so that the newly created impulse response will reflect the movement of the sound generating point S and the change in direction (step Sb6). The procedure for creating the impulse response is the same as mentioned above with reference to FIG. 9. After that, the CPU 10 instructs the convolution operator 221 of each reproduction processing unit 22 on the impulse response newly created at step Sb6 (step Sb7). As a result, sounds outputted from the speakers 30 after completion of this processing are imparted with the acoustic effect that reflects the change in orientation of the sound generating point S.

The timer interrupt processing described above is repeated at regular time intervals until the user instructs the end of the reproduction of the sound field. Consequently, the movement of each point and a change in orientation of the sound generating point S resulting from the movement are reflected in sound outputted from the speakers 30 whenever necessary in accordance with instructions from the user.

As discussed above, in the embodiment, the orientation of the sound generating point S is automatically determined according to its position (without the need to get instructions from the user). Therefore, the user does not need to specify the orientation of the sound generating point S separately from the position of each point. In other words, the embodiment allows the user to change the orientation of the sound generating point S with a simple operation.

Further, in the embodiment, there are prepared three operation modes, each of which determines the orientation of the sound generating point S from the position of the sound generating point S in a different way. In the first operation mode, since the sound generating point S always faces the sound receiving point R, it is possible to reproduce an acoustic space, for example, in which a player playing a musical instrument like a trumpet moves while always pointing the musical instrument at the audience. In the second operation mode, since the sound generating point S always faces the target point T, it is possible to reproduce an acoustic space, for example, in which a player playing a musical instrument moves while always pointing the musical instrument at a specific target. In the third operation mode, since the sound generating point S faces its direction of movement, it is possible to reproduce an acoustic space, for example, in which a player playing a musical instrument moves while pointing the musical instrument in its direction of movement (e.g., where the player marches playing the musical instrument).

B

Second Embodiment

A reverberation imparting apparatus according to the second embodiment of the present invention will next be described. While the first embodiment illustrates the structure in which the orientation of the sound generating point S is determined according to its position, this embodiment illustrates another structure in which the orientation of the sound receiving point R is determined according to its position. In this embodiment, components common to those in the reverberation imparting apparatus 100 according to the first embodiment are given the same reference numerals, and the description of the structure and operation common to those in the first embodiment are omitted as needed.

In the second embodiment, there are prepared three operation modes, each of which determines the orientation of the sound receiving point R from its position in a different way. In the first operation mode, the orientation of the sound receiving point R is determined so that the sound receiving point R will always face the sound generating point S. In the second operation mode, the orientation of the sound receiving point R is determined so that the sound receiving point R will always face the target point T. In the third operation mode, the orientation of the sound receiving point R is determined so that the sound receiving point R will always face its direction of movement.

The operation of this embodiment is the same as that of the first embodiment except that the orientation of the sound receiving point R instead of the sound generating point S is reflected in the impulse response. Specifically, at step sa3 shown in FIG. 6, a recipe file RF is so created as to include, in addition to the kind of acoustic space, the kind, position, and orientation of the sound generating point S, and the kind and position of the sound receiving point R determined at step Sa2, an initial value of the orientation of the sound receiving point R according to the operation mode specified at step Sa1. Then, at step Sb1 shown in FIG. 12, the CPU 10 determines whether the user instructs the movement of any one of the sound receiving point R, the sound generating point S, and the target point T. If determining that the user has given an instruction, the CPU 10 determines the orientation of the sound receiving point R according to the position of each point after the movement and the selected operation mode (step Sb2) and updates the recipe file RF to change the orientation of the sound receiving point R (step Sb3). The other operations are the same as those in the first embodiment.

In the embodiment, since the orientation of the sound receiving point R is automatically determined according to its position, the position and orientation of the sound receiving point R can be changed with a simple operation. In the first operation mode, since the sound receiving point R faces the sound generating point S regardless of the position of the sound receiving point R, it is possible to reproduce an acoustic space, for example, in which the audience moves facing a player playing a musical instrument. In the second operation mode, since the sound receiving point R always faces the target point T, it is possible to reproduce an acoustic space, for example, in which the audience listening to performance of a musical instrument(s) moves facing a specific target at all times. In the third operation mode, since the sound receiving point R always faces its direction of movement, it is possible to reproduce an acoustic space, for example, in which the audience listening to performance of a musical instrument(s) moves facing its direction of movement.

C

Modifications

The aforementioned embodiments are just illustrative examples of implementing the invention, and various modifications can be carried out without departing from the scope of the present invention. The following modifications can be considered.

C-1

Modification 1

The orientation of the sound generating point S in the first embodiment and the orientation of the sound receiving point R in the second embodiment are changed in accordance with instructions from the user, respectively. These embodiments may be combined to change both the directions of the sound generating point S and the sound receiving point R and reflect the changes in the impulse response.

C-2

Modification 2

Figure 13:
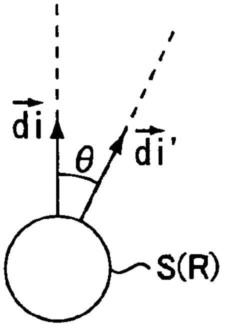
FIG. 13 is an illustration for explaining the orientation of a sound generating point according to a modification of the present invention.

The first embodiment illustrates the structure in which the sound generating point S faces any one of the directions of the sound receiving point R and the target point T, and the direction of movement of the sound generating point S. Alternatively, the sound generating point S may face a direction at a specific angle with respect to one of these directions. In other words, an angle θ may be determined in accordance with instructions from the user. In this case, as shown in FIG. 13, a direction at the angle θ with respect to the direction di determined by one of the aforementioned equations (1) to (3) (that is, one of the directions of the sound receiving point R and the target point T, and the direction of movement of the sound generating point S) is identified as a direction di' of the sound generating point S. Specifically, the direction di' of the sound generating point S can be determined from the unit vector di determined by one of the aforementioned equations (1) to (3) using the following equation (4):

$$\vec{d}_i' = \begin{pmatrix} \cos\theta & -\sin\theta \\ \sin\theta & -\cos\theta \end{pmatrix} \vec{d}_i \tag{4}$$

According to this structure, it is possible to reproduce an acoustic space in which the sound generating point S moves facing a direction at a certain angle with respect to the orientation of the sound receiving point R or the target point T, or the direction of movement of the sound generating point S. Further, although the orientation of the sound generating point S is taken into account in this example, the same structure can be adopted in the second embodiment in which the orientation of the sound receiving point R is changed. In this case, an angle θ is determined in accordance with instructions from the user so that a direction at the angle θ with respect to the orientation of the sound generating point S or the target point T, or the direction of movement of the sound receiving point R will be identified as the orientation of the sound receiving point R.

C-3

Modification 3

The way of determining an impulse response is not limited to those shown in each of the aforementioned embodiments. For example, a great number of impulse responses that exhibit different position relations may be measured in actual acoustic spaces beforehand so that an impulse response corresponding to the orientation of the sound generating point S or the sound receiving point R will be selected from among these impulse responses for use in a convolution operation. To sum up, it is enough that an impulse response is determined in the first embodiment according to the directional characteristics and orientation of the sound generating point S and an impulse response is determined in the second embodiment according to the directional characteristics and orientation of the sound receiving point R.

C-4

Modification 4

Although the aforementioned embodiments illustrate the structures using four reproduction channels, the number of reproduction channels is not fixed. Further, the aforementioned embodiments use the XYZ orthogonal coordinate system for describing the positions of the sound generating point S, the sound receiving point R, and the target point T, but any other coordinate system may also be used.

Further, the number of points for the sound generating point S and the sound receiving point R is not limited to one for each point, and acoustic spaces in which two or more sound generating points S or two or more sound receiving points R are arranged may be reproduced. When there are two or more sound generating points S and two or more sound receiving points R, the CPU 10 determines a sound ray path for each of the two or more sound generating points S at step Sa5 in FIG. 6 and at step Sb4 in FIG. 12. In this case, the sound ray path determined is a sound ray path along which sound emitted from the sound generating point S travels until it reaches each corresponding sound receiving point R.

As described above, according to the present invention, when an acoustic effect of a specific acoustic space is imparted to an audio signal, instructive operations for specifying the position and orientation of the sound generating point S or the sound receiving point R in the acoustic space can be simplified.

What is claimed is:

1. A reverberation apparatus for creating an acoustic effect of an acoustic space which is arranged with a sound generating point for generating a sound, said sound generating point having an orientation oriented in an initial direction to a target point and a sound receiving point for receiving the sound which travels from the sound generating point to the sound receiving point through sound ray paths within the acoustic space, and for applying the created acoustic effect to an audio signal representative of the sound generated from the sound generating point, the reverberation apparatus comprising:

a storage device that stores a directional characteristic representing a directivity of the generated sound at the sound generating point; and a hardware processor comprising a position indicating section that indicates a position of the sound generating point and a position of the sound receiving point within the acoustic space;

an orientation control section that identifies the direction to the target point from the sound generating point at the position indicated by the position indicating section, and changes the orientation of the sound generating point to be oriented in the identified direction within the acoustic space without user input;

an impulse response determining section that determines an impulse response for each of the sound ray paths along which the sound emitted from the sound generating point travels to reach the sound receiving point, in accordance with the directional characteristic of the generated sound stored in the storage device and the orientation of the sound generating point changed by the orientation control section; and a calculation section that performs a convolution operation between the impulse response determined by the impulse response determining section and the audio signal representing the sound generated from the sound generating point so as to apply thereto the acoustic effect.

2. The reverberation apparatus according to claim 1 wherein the orientation control section sets the target point to the sound receiving point in accordance with an instruction by a user.

3. The reverberation apparatus according to claim 1, wherein the orientation control section identifies a first direction to the target point from the sound generating point at the position indicated by the position indicating section, and changes the orientation of the sound generating point to a second direction making a predetermined angle with respect to the identified first direction.

4. The reverberation apparatus according to claim 3, wherein the orientation control section sets the target point to the sound receiving point in accordance with an instruction by a user.

5. The reverberation apparatus according to claim 1, wherein the position indicating section indicates the position of the sound generating point which moves in accordance with an instruction from a user, and wherein the orientation control section identifies based on the indicated position of the sound generating point a progressing direction along which the sound generating point moves, and changes the orientation of the sound generating point to the identified progressing direction.

6. The reverberation apparatus according to claim 1, wherein the position indicating section indicates the position of the sound generating point which moves in accordance with an instruction from a user, and wherein the orientation control section identifies based on the indicated position of the sound generating point a progressing direction along which the sound generating point moves, and changes the orientation of the sound generating point to an angular direction making a predetermined angle with respect to the identified progressing direction.

7. A reverberation apparatus for creating an acoustic effect of an acoustic space which is arranged with a sound generating point for generating a sound and a sound receiving point for receiving the sound which travels from the sound generating point to the sound receiving point through sound ray paths within the acoustic space, said sound receiving point having an orientation oriented in an initial direction to a target point, and for applying the created acoustic effect to an audio signal representative of the sound generated from the sound generating point, the reverberation apparatus comprising:

a storage device that stores a directional characteristic of a sensitivity of the sound receiving point for the received sound;

a position indicating section that indicates a position of the sound receiving point and a position of the sound generating point within the acoustic space on the basis of an instruction from a user; and a hardware processor comprising an orientation control section that identifies the direction to the target point from the sound receiving point at the position indicated by the position indicating section, and changes the orientation of the sound receiving point to be oriented in the identified direction without user input;

an impulse response determining section that determines an impulse response for each of the sound ray paths along which the sound emitted from the sound generating point travels to reach the sound receiving point, in accordance with the directional characteristic of the sensitivity for the received sound stored in the storage device and the orientation of the sound receiving point changed by the orientation control section; and a calculation section that performs a convolution operation between the impulse response determined by the impulse response determining section and the audio signal representing the sound generated from the sound generating point so as to apply thereto the acoustic effect.

8. The reverberation apparatus according to claim 7, wherein the orientation control section sets the target point to the sound generating point in accordance with an instruction by a user.

9. The reverberation apparatus according to claim 7, wherein the orientation control section identifies a first direction to the target point from the sound receiving point at the position indicated by the position indicating section, and changes the orientation of the sound receiving point to a second direction making a predetermined angle with respect to the identified first direction.

10. The reverberation apparatus according to claim 9, wherein the orientation control section sets the target point to the sound generating point in accordance with an instruction by a user.

11. The reverberation apparatus according to claim 7, wherein the position indicating section indicates the position of the sound receiving point which moves in accordance with an instruction from a user, and wherein the orientation control section identifies based on the indicated position of the sound receiving point a progressing direction along which the sound receiving point moves, and changes the orientation of the sound receiving point to the identified progressing direction.

12. The reverberation apparatus according to claim 7, wherein the position indicating section indicates the position of the sound receiving point which moves in accordance with an instruction from a user, and wherein the orientation control section identifies based on the indicated position of the sound receiving point a progressing direction along which the sound receiving point moves, and changes the orientation of the sound receiving point to an angular direction making a predetermined angle with respect to the identified progressing direction.

13. A machine readable medium encoded with a reverberation program executable by a computer for creating an acoustic effect of an acoustic space which is arranged with a sound generating point for generating a sound, said sound generating point having an orientation oriented in an initial direction to a target point and a sound receiving point for receiving the sound which travels from the sound generating point to the sound receiving point through sound ray paths within the acoustic space, and for applying the created acoustic effect to an audio signal representative of the sound generated from the sound generating point, the reverberation program comprising the instructions of:

providing a directional characteristic representing a directivity of the generated sound at the sound generating point;

indicating a position of the sound generating point and a position of the sound receiving point within the acoustic space;

identifying the direction to the target point from the sound generating point as the position indicated by the instruction of indicating and changing orientation of the sound generating point to be oriented in the identified direction without user input;

determining an impulse response for each of the sound ray paths along which the sound emitted from the sound generating point travels to reach the sound receiving point, in accordance with the provided directional characteristic of the generated sound and the changed orientation of the sound generating point; and performing a convolution operation between the determined impulse response and the audio signal representing the sound generated from the sound generating point so as to apply thereto the acoustic effect.

14. A machine readable medium encoded with a reverberation program executable by a computer for creating an acoustic effect of an acoustic space which is arranged with a sound generating point for generating a sound and a sound receiving point for receiving the sound which travels from the sound generating point to the sound receiving point through sound ray paths within the acoustic space, said sound receiving point having an orientation oriented in an initial direction to a target point, and for applying the created acoustic effect to an audio signal representative of the sound generated from the sound generating point, the reverberation program comprising the instructions:

providing a directional characteristic of a sensitivity of the sound receiving point for the received sound;

indicating a position of the sound receiving point and a position of the sound generating point within the acoustic space;

identifying the direction to the target point from the sound receiving point indicated by the instruction of indicating and changing orientation of the sound receiving point to be oriented in the identified direction without user input;

determining an impulse response for each of the sound ray paths along which the sound emitted from the sound generating point travels to reach the sound receiving point, in accordance with the provided directional characteristic of the sensitivity for the received sound and the changed orientation of the sound receiving point; and performing a convolution operation between the determined impulse response and the audio signal representing the sound generated from the sound generating point so as to apply thereto the acoustic effect.

15. A reverberation method of creating an acoustic effect for an acoustic space which is arranged with a sound generating point for generating a sound, said sound generating point having an orientation oriented in an initial direction to a target point, and a sound receiving point for receiving the sound which travels from the sound generating point to the sound receiving point through sound ray paths within the acoustic space, and applying the created acoustic effect to an audio signal representative of the sound generated from the sound generating point, the reverberation method comprising the steps of:

providing a directional characteristic representing a directivity of the generated sound at the sound generating point;

indicating a position of the sound generating point and a position of the sound generating point within the acoustic space;

identifying the direction to the target point from the sound generating point at the position indicated by the step of indicating and changing the orientation of the sound generating point to be oriented in the identified direction without user input;

determining an impulse response for each of the sound ray paths along which the sound emitted from the sound generating point travels to reach the sound receiving point, in accordance with the provided directional characteristic of the generated sound and the changed orientation of the sound generating point; and performing a convolution operation between the determined impulse response and the audio signal representing the sound generated from the sound generating point so as to apply thereto the acoustic effect.

16. A reverberation method of creating an acoustic effect for an acoustic space which is arranged with a sound generating point for generating a sound and a sound receiving point for receiving the sound which travels from the sound generating point to the sound receiving point through sound ray paths within the acoustic space, said sound receiving point having an orientation oriented in an initial direction to a target device, and applying the created acoustic effect to an audio signal representative of the sound generated from the sound generating point, the reverberation method comprising the steps of:

providing a directional characteristic of a sensitivity of the sound receiving point for the received sound;

indicating a position of the sound receiving point and a position of the sound generating point within the acoustic space;

identifying the direction to the target point from the sound receiving point at the position indicated by the step of indicating, and changing the orientation of the sound receiving point to be oriented in the identified direction without user input;

determining an impulse response for each of the sound ray paths along which the sound emitted from the sound generating point travels to reach the sound receiving point, in accordance with the provided directional characteristic of the sensitivity for the received sound and the changed orientation of the sound receiving point; and performing a convolution operation between the determined impulse response and the audio signal representing the sound generated from the sound generating point so as to apply thereto the acoustic effect.

* * * * *